(12) United States Patent
Jin et al.

(10) Patent No.: US 8,896,031 B2
(45) Date of Patent: Nov. 25, 2014

(54) ORGANIC LIGHT EMITTING DISPLAY DEVICE AND METHOD FOR MANUFACTURING THE SAME

(75) Inventors: Guang Hai Jin, Yongin (KR); Jae-Beom Choi, Yongin (KR); Kwan-Wook Jung, Yongin (KR); June-Woo Lee, Yongin (KR); Moo-Jin Kim, Yongin (KR); Ga-Young Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 49 days.

(21) Appl. No.: 13/602,410

(22) Filed: Sep. 4, 2012

(65) Prior Publication Data

US 2013/0240914 A1 Sep. 19, 2013

(30) Foreign Application Priority Data

Mar. 16, 2012 (KR) .................. 10-2012-0027319

(51) Int. Cl.
*H01L 23/52* (2006.01)

(52) U.S. Cl.
USPC ............... 257/211; 438/145; 349/33; 349/41

(58) Field of Classification Search
None
See application file for complete search history.

(56) References Cited

U.S. PATENT DOCUMENTS

2001/0050730 A1* 12/2001 Tsukao ........................... 349/54
2010/0193778 A1* 8/2010 An et al. ........................ 257/40

FOREIGN PATENT DOCUMENTS

| KR | 10-2004-0098603 A | 11/2004 |
| KR | 10-2006-0132163 A | 12/2006 |
| KR | 10-2007-0066264 A | 6/2007 |

* cited by examiner

*Primary Examiner* — Whitney T Moore
*Assistant Examiner* — Joseph Galvin, III
(74) *Attorney, Agent, or Firm* — Lee & Morse, P.C.

(57) ABSTRACT

An organic light emitting diode (OLED) display includes a substrate where a plurality of pixels are formed, a first pixel defining layer on the substrate, the first pixel defining layer dividing the plurality of pixels, a connection wire on the first pixel defining layer, the connection wire electrically connecting two adjacent pixels, and a second pixel defining layer on the first pixel defining layer, the second pixel defining layer covering the connection wire.

11 Claims, 7 Drawing Sheets

ORGANIC LIGHT EMITTING DISPLAY DEVICE AND METHOD FOR MANUFACTURING THE SAME

CROSS-REFERENCE TO RELATED APPLICATION

This application claims priority to and the benefit of Korean Patent Application No. 10-2012-0027319 filed in the Korean Intellectual Property Office on Mar. 16, 2012, the entire contents of which are incorporated herein by reference.

BACKGROUND

The described technology relates generally to an organic light emitting diode (OLED) display and a manufacturing method thereof.

SUMMARY

Embodiments are directed to an organic light emitting diode (OLED) display, including a substrate having a plurality of pixels, a first pixel defining layer on the substrate, the first pixel defining layer dividing the plurality of pixels, a connection wire on the first pixel defining layer, the connection wire electrically connecting two adjacent pixels, and a second pixel defining layer on the first pixel defining layer, the second pixel defining layer covering the connection wire.

Each of the plurality of pixels may include a pixel electrode and a pixel terminal extending from the pixel electrode. The first pixel defining layer may include one or more connection holes exposing respective pixel terminals of the two adjacent pixels.

The connection wire may electrically connect the two adjacent pixels through the connection holes.

One of the two adjacent pixels may be a defective pixel and the another one of the two adjacent pixels may be a normal pixel. The defective pixel may be driven by a signal applied to the normal pixel.

A plurality of thin film transistors may be provided between the substrate and each pixel terminal to supply a signal for driving each pixel. The normal pixel of the two adjacent pixels may be electrically connected with a respective one of the thin film transistors corresponding to the normal pixel. The defective pixel of the two adjacent pixels may be electrically disconnected from a respective one the thin film transistors corresponding to the defective pixel.

The connection wire may include at least one of tungsten, chromium, molybdenum, aluminum, titanium, and tantalum, or an alloy thereof.

The first pixel defining layer may include a plurality of first openings to expose each the pixel electrode. The second pixel defining layer may include a plurality of second openings to expose each pixel electrode.

The second pixel defining layer may be disposed to fill the connection holes.

The second pixel defining layer may be disposed between pixel terminals of the two adjacent pixels.

Pixel terminals of the two adjacent pixels may be exposed through a single connection hole. The first pixel defining layer may include a first portion formed in a connection hole and a second portion relatively thicker than the first portion.

The second pixel defining layer may cover the first portion. An upper side of the second pixel defining layer and an upper side of the second portion of the first pixel defining layer may correspond to each other.

Embodiments are also directed to a manufacturing method of an organic light emitting diode (OLED) display, the manufacturing method including forming a plurality of pixels and a plurality of thin film transistors electrically connected to the plurality of pixels, respectively, on a substrate, forming a first pixel defining layer dividing the plurality of pixels, detecting a defective pixel by testing the plurality of pixels, disconnecting an electrical connection between the defective pixel and a respective one of the thin film transistors, forming a connection wire for electrical connection between the defective pixel and a pixel adjacent to the defective pixel, and forming a second pixel defining layer on the first pixel defining layer to cover the connection wire.

The pixels may respectively include pixel electrodes and pixel terminals extended from the pixel electrodes. The thin film transistors may be electrically connected with the pixel terminals.

The forming of the connection wire may include forming a connection hole by removing a portion of the first pixel defining layer to expose the defective pixel and the pixel terminal of the pixel that is adjacent to the defective pixel.

The forming of the connection wire may include connecting the pixel terminal of the defective pixel and the pixel terminal of the pixel that is adjacent to the defective pixel with the connection wire through the connection hole.

The forming of the connection wire may include depositing at least one of tungsten, chromium, molybdenum, aluminum, titanium, and tantalum, or an alloy thereof using a chemical vapor deposition method.

The disconnecting the electrical connection between the defective pixel and the respective one of the thin film transistors may include cutting the electrical connection using a laser.

Each thin film transistor may include a semiconductor layer, a source electrode, and a drain electrode, the source electrode and the drain electrodes contacting the semiconductor layer. The disconnecting of the electrical connection between the defective pixel and the respective one of the thin film transistors includes cutting the source electrode or the drain electrode.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

Throughout the specification, like reference numerals designate like elements throughout the specification.

It shall be noted that the drawings are schematic and do not depict exact dimensions. The relative proportions and ratios of elements in the drawings may be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is said to be "over" or "on" another part, the one part may be directly over the other part or may be accompanied by another part interposed therebetween.

Exemplary embodiments specifically show preferred exemplary embodiments. As a result, various modifications of the drawings are anticipated. Accordingly, exemplary embodiments are not limited to certain forms of the regions illustrated, but may include forms that are modified through manufacturing, for example.

Hereinafter, an organic light emitting diode display according to an exemplary embodiment will be described with reference to FIG. 1 and FIG. 2.

Figure 1:
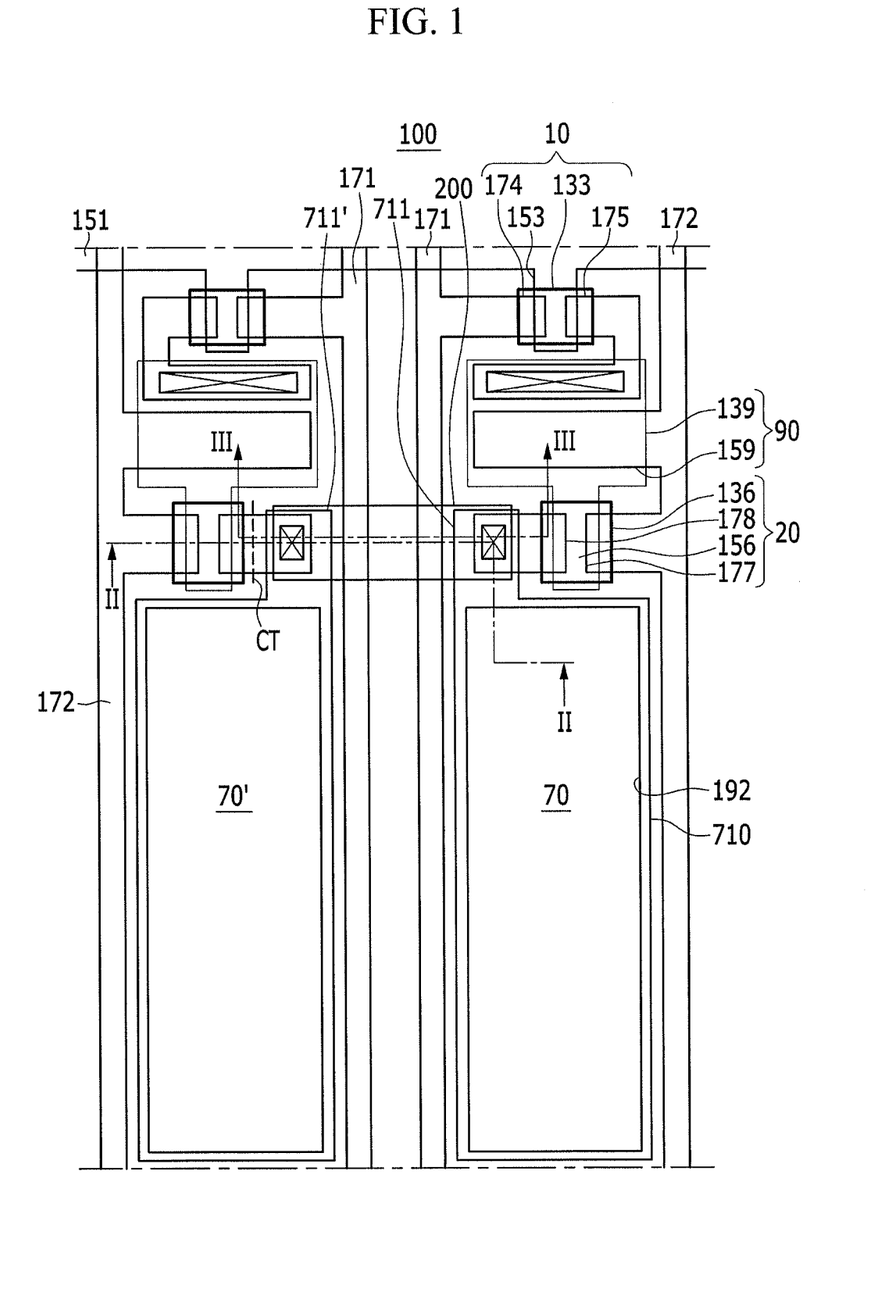
FIG. 1 illustrates a layout view of a pixel structure of an organic light emitting diode display according to an exemplary embodiment.

FIG. 1 is a layout view of a pixel structure of an organic light emitting diode (OLED) display according to an exemplary embodiment.

As shown in FIG. 1, an OLED display 100 according to the exemplary embodiment includes a plurality of pixel areas. Each pixel may have a 2Tr-1Cap structure with an organic light emitting diode 71, two thin film transistors 10 and 20, and a capacitor 90. Here, the term "pixel area" may refer to a unit area where a pixel, which is a minimum unit for displaying an image, is formed. However, in other configurations, the pixel may be variously modified.

For example, each pixel are of the OLED display 100 may have a structure in which three or more thin film transistors and two or more capacitors are provided. In addition, the OLED display 100 may include additional connecting lines, such that the OLED display 100 may have various structures. At least one of additionally formed thin film transistors and capacitors may constitute a compensation circuit. The compensation circuit may improve the uniformity of the OLED 71 formed in the pixel areas PE so as to suppress image quality deviation. The compensation circuit may include two to eight thin film transistors.

In further detail, in the exemplary embodiment, the OLED display 100 may include a first thin film transistor 10 and a second thin film transistor 20 formed in each pixel area. The first thin film transistor 10 and the second thin film transistor 20 may respectively include gate electrodes 153 and 156, active layers 133 and 136, source electrodes 174 and 177, and drain electrodes 175 and 178.

A gate line 151, a data line 171, and a common power line 172 may be formed on a substrate 110. Each pixel area may be defined by the gate line 151, the data line 171, and the common power line 172. However, in other implementations, the pixel area may be variously modified. In addition, although it is not illustrated, a capacitor line may be additionally formed on the substrate 110.

A source electrode 174 of the first thin film transistor 10 may be connected to the data line 171, and a gate electrode 153 of the first thin film transistor 10 may be connected to the gate line 151. A node may be formed between a drain electrode 175 of the first thin film transistor 10 and a capacitor 90 such that the drain electrode 175 of the first thin film transistor 10 is connected with a first capacitor electrode 139 of the capacitor 90. A second capacitor electrode 159 may be connected with the common power line 172. The drain electrode 175 of the first thin film transistor 10 may be connected with the gate electrode 156 of the second thin film transistor 20. The common power line 172 may be connected to a source electrode 177 of the second thin film transistor 20, and an anode of the organic light emitting element 70 may be connected to the drain electrode 178.

The organic light emitting element 70 may includes the anode, which may be a hole injection electrode, a cathode, which may be an electron injection electrode, and an organic emission layer 720 provided between the anode and the cathode. Meanwhile, according to a driving method, locations of the anode and the cathode of the organic light emitting element may be switched. Hereinafter, in the exemplary embodiment, the anode is a pixel electrode 710 and the cathode is a common electrode 730.

The first thin film transistor 10 may be used as a switch for selecting a pixel area for light emission. When the first thin film transistor 10 is instantly turned on, the capacitor 90 is charged, and the amount of the charge charged at this time is proportional to the potential of the voltage applied from the data line 171. In addition, a gate potential of the second thin film transistor 20 is increased according to a potential charged in the capacitor 90 while the first thin film transistor 10 is in the turned-off state. The second thin film transistor 20 is turned on when the gate potential exceeds a threshold voltage. Then, a voltage applied to the common power line 172 is applied to the organic light emitting element 71 through the second thin film transistor 20 such that the organic light emitting element 71 emits light.

The structure of the pixel PE may be variously modified.

The structure of the OLED display according to the exemplary embodiment will be described in further detail with reference to FIG. 1 and FIG. 2.

Figure 2:
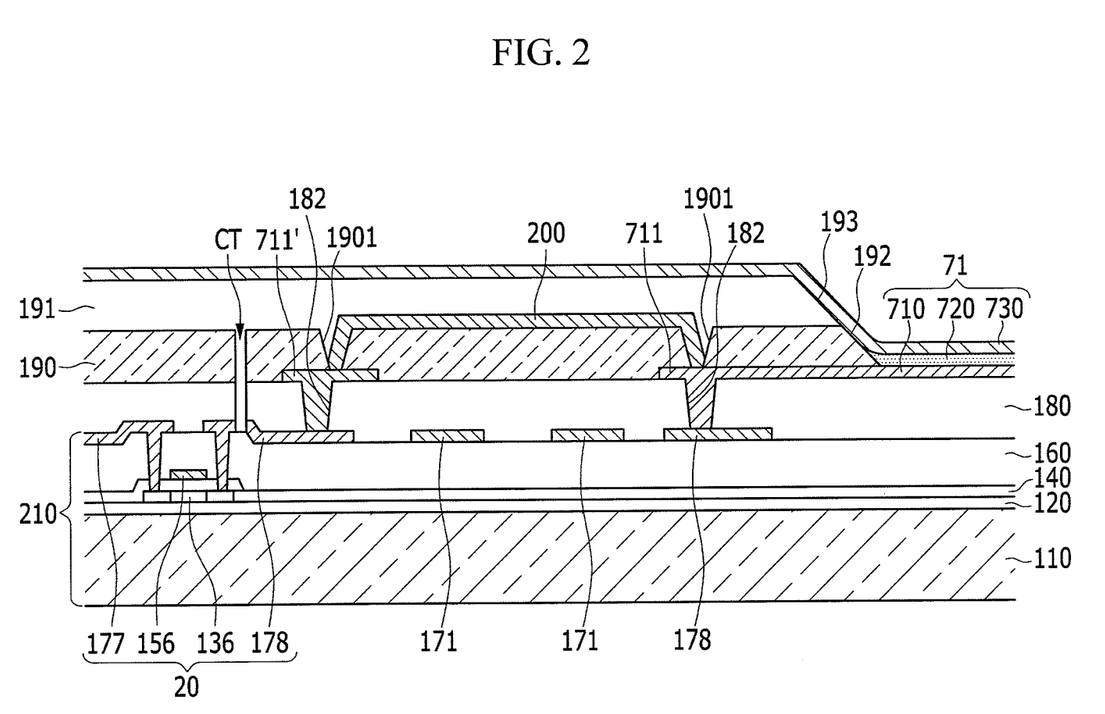
FIG. 2 illustrates a cross-sectional view of FIG. 1, taken along the line II-II.

FIG. 2 is a cross-sectional view of FIG. 1, taken along the line II-II.

As shown in FIG. 2, a buffer layer 120 may be formed on the substrate 110. The buffer layer 120 may be formed through chemical vapor deposition or physical vapor deposition and may have a single-layered structure or a multi-layered structure including various insulating layers, such as a silicon oxide film, silicon nitride film, and the like. The buffer layer 120 may serve to prevent moisture or impurities generated from the substrate 110 from spreading or infiltrating beyond the substrate 110. The buffer layer 120 may also smooth the surface of the substrate 110, and regulate a heat transfer speed during a crystallization process performed for forming the active layers to thus accomplish desirable crystallization. The buffer layer 120 may be omitted according to the type and process condition of the substrate 110.

The active layers 133 and 136 and the first capacitor electrode 139 may be formed on the buffer layer 120. An amorphous silicon layer may be formed on the buffer layer 120, crystallized, and then patterned such that the active layers 133 and 136 and the first capacitor electrode 139 are formed. However, in other implementations, the first capacitor electrode 139 and the active layer 139 may be formed of different materials, as desired.

A gate insulating layer 140 may be formed on the active layers 133 and 136 and the first capacitor electrode 139. In further detail, the gate insulating layer 140 may be formed to cover the active layers 133 and 136 and the first capacitor electrode 139 on the buffer layer 120. The gate insulating layer 140 may be formed including at least one of various suitable insulation materials, such as tetra ethyl ortho silicate (TEOS), silicon nitride ($SiN_x$), and silicon oxide ($SiO_2$).

The gate line 151 including gate electrodes 153 and 156 and a second capacitor electrode 159 may be formed on the gate insulating layer 140. The gate electrode 153 and 156 may at least partially overlap the active layers 133 and 136.

An interlayer insulating layer 160 may be formed on the gate insulating layer 140 to cover the gate electrodes 153 and 156, the second capacitor electrode 159, and gate line 151. The gate insulating layer 140 and the interlayer insulating layer 160 may have through-holes to partially expose the active layers 133 and 136. The interlayer insulating layer 160 and the gate insulating layer 140 may be formed of the same material.

The data line 171, which may include source electrodes 174 and 177 and drain electrodes 175 and 178 and the common power line 172, may be formed on the interlayer insulating layer 160. The source electrodes 174 and 177 and the drain electrodes 175 and 178 may be connected with the active layers 133 and 136 through the through-holes formed in the interlayer insulating layer 160 and the gate insulating layer 140.

As described, the first and second thin film transistors 10 and 20 including the active layers 133 and 136, the gate electrodes 153 and 156, the source electrodes 174 and 177, and the drain electrodes 175 and 178 and the wire portions 210 including the gate line 151, the data line 171, the common power line 172, and the capacitor 90 may be formed. The configuration of the wire portion 210 may be variously modified.

A protection insulating layer 180 may be formed on the interlayer insulating layer 160 to cover the source electrodes 174 and 177, the drain electrodes 175 and 178, and the data line 171. The protection insulating layer 180 may be formed of various suitable materials. The protection insulating layer 180 may have a contact hole 182 that partially exposes the drain electrode 178 of the second thin film transistor 20. The configuration of the protection insulating layer 180 may be varied. In other implementations, one of the protection insulating layer 180 and the interlayer insulating layer 160 may be omitted or the protection insulating layer 180 may be partially cover the wire portion 210.

A pixel electrode 710 of the organic light emitting element 71 and a pixel terminal 711 extended from the pixel electrode 710 may be formed on the protection insulating layer 180. That is, the OLED display 100 may include a plurality of pixel electrodes 710 disposed at a distance from each other in each of the plurality of pixel areas. The pixel terminal 711 may be connected with the drain electrode 178 through the contact hole 182 of the protection insulating layer 180. The configurations of the pixel electrode 710 and the pixel terminal 711 may be varied. For example, the pixel electrode 710 and the pixel terminal 711 may be formed on the interlayer insulating layer 160 or on the gate insulating layer 140, and the pixel terminal 711 may have a single-layered or multi-layered structure.

In addition, a first pixel defining layer having a plurality of first openings 192 that expose the pixel electrode 710 of each pixel area may be formed on the protection insulating layer 180. The first pixel defining layer 190 may be formed of various suitable organic or inorganic materials. For example, the first pixel defining layer 190 may be formed by patterning a photosensitive organic layer and thermally or optically baking the patterned photosensitive organic layer.

The organic emission layer 720 may be formed on the pixel electrode 710 on the first opening 192 of the first pixel defining layer 190.

The first pixel defining layer 190 may have a connection hole 1901 that exposes the pixel terminal 711. A connection wire 200 and a second pixel defining layer 191 may be formed on the first pixel defining layer 190. The connection hole 1901, the connection wire 200, and the second pixel defining layer 191 will be described in detail below.

A common electrode 730 may be formed on the organic emission layer 720 and the first and second pixel defining layers 190 and 191. Thereby, the organic light emitting element 71 including the pixel electrode 710, the organic emission layer 720, and the common electrode 730 may be formed. The organic emission layer 720 may be formed of a low molecular organic material or a high molecular organic material, and may be formed as a plurality of organic layers including an emission layer. The pixel electrode 710 and the common electrode 730 may be respectively formed of a transparent conductive material or may be formed of a semitransparent or reflective conductive material. The OLED display 100 may be a top emission type, a bottom emission type, or a double-sided emission type according to the kind of the materials that form the first electrode 710 and the second electrode 730. Such a configuration of the organic light emitting element 70 may be variously modified.

At least one of the plurality of pixel areas of the OLED display 100 may include the connection wire 200 electrically connected with a neighboring pixel area. That is, a defective pixel having an emission problem in a pixel area may be produced during a manufacturing process of the OLED display 100. The defective pixel may be noticeable as a dark spot in the completed OLED display 100 if the defective pixel is not repaired during the manufacturing process. Herein, the term "defective pixel" may refer to a pixel that functions to emit light when provided with a driving signal, but for various reasons, such as a defect in a corresponding transistor or signal line, does not receive the normal driving signal. Thus, the defective pixel may be driven to emit light by electrically connecting the pixel with a normal pixel adjacent thereto, thereby repairing the defective pixel for normal operation according to a signal transmitted to the normally operating pixel.

In FIG. 1 and FIG. 2, the pixel area having the defect is indicated by reference numeral 70' (hereinafter, referred to as a "defective pixel") and a normal pixel area adjacent to the defective pixel is indicated by reference numeral 70 (hereinafter, referred to as a "normal pixel"). In addition, a pixel terminal of the defective pixel is indicated by reference numeral 711', and a pixel terminal of the adjacent normal pixel is indicated by reference numeral 711.

As shown in FIG. 2, the first pixel defining layer 190 may include connection holes 1901 that expose the pixel terminal 711' of the defective pixel 70' and the pixel terminal 711 of the normal pixel 70. The connection wire 200 that connects the pixel terminal 711' of the defective pixel 70' and the pixel terminal 711 of the normal pixel 70 through the connection holes 1901 may be formed on the first pixel defining layer 190. The connection wire 200 may include at least one material selected from tungsten (W), chromium (Cr), molybdenum (Mo), aluminum (Al), titanium (Ti), and tantalum (Ta), or may include an alloy thereof.

In the defective pixel 70', the pixel terminal 711' and the thin film transistor 20 are disconnected. In further detail, the pixel terminal 711' of the defective pixel 70' is manufactured to include an electric connection with the drain electrode 178 of the second thin film transistor 20 through the contact hole 182 of the protection insulating layer 180. Accordingly, in order to block the application of a defective signal to an organic light emitting element of the defective pixel 70a, a cutting portion CT may be formed in the drain electrode 177 between the pixel terminal 711' and the second thin film transistor 20'. The cutting portion CT in the present exemplary embodiment may be formed at a portion where the drain electrode 178 is connected with the pixel terminal 711' and at a portion where the drain electrode 178 is not connected with the pixel terminal 711'. In further detail, the cutting portion CT may be formed as a hole that separates the drain electrode 178, as described above, while penetrating to the drain electrode 178 from the first pixel defining layer 190. The configuration of the cutting portion CT can be modified in various suitable configurations to block a signal applied to the defective pixel 70' from the second thin film transistor 20.

The second pixel defining layer 191 may be formed on the first pixel defining layer 190 to cover the connection wire 200. Like the first pixel defining layer 190, the second pixel defining layer 191 may include a second opening 193 that exposes the pixel electrode 710. In addition, the second pixel defining layer 191 may be formed to thoroughly fill the connection hole 1901 and the cutting portion CT formed in the first pixel defining layer 190.

Like the first pixel defining layer 190, the second pixel defining layer 191 may be formed of various organic or inorganic materials, and, for example, may be formed by patterning a photosensitive organic layer and thermally or optically baking the patterned photosensitive organic layer.

With such a configuration, the defective pixel 70' may operate by the same signal as the normal signal applied to the normal pixel 70. In the OLED display 100, although the defective pixel 70' is generated due to a failure in a thin film transistor in one pixel area, the defective pixel 70' may emit light together with the adjacent normal pixel 70 by a normal signal applied through the normal pixel 70.

Accordingly, in the OLED display 100 according to the present exemplary embodiment, the defective pixel generated during the manufacturing process may not appear as a dark spot.

Hereinafter, a method for recovering a defective pixel in a manufacturing process of the OLED display according to the exemplary embodiment will be described with reference to FIG. 3A to FIG. 3D.

FIG. 3A to FIG. 3D are cross-sectional views of a process for recovering the failure in the manufacturing process of the OLED display according to the exemplary embodiment, taken along the line of FIG. 1.

Figure 3A:
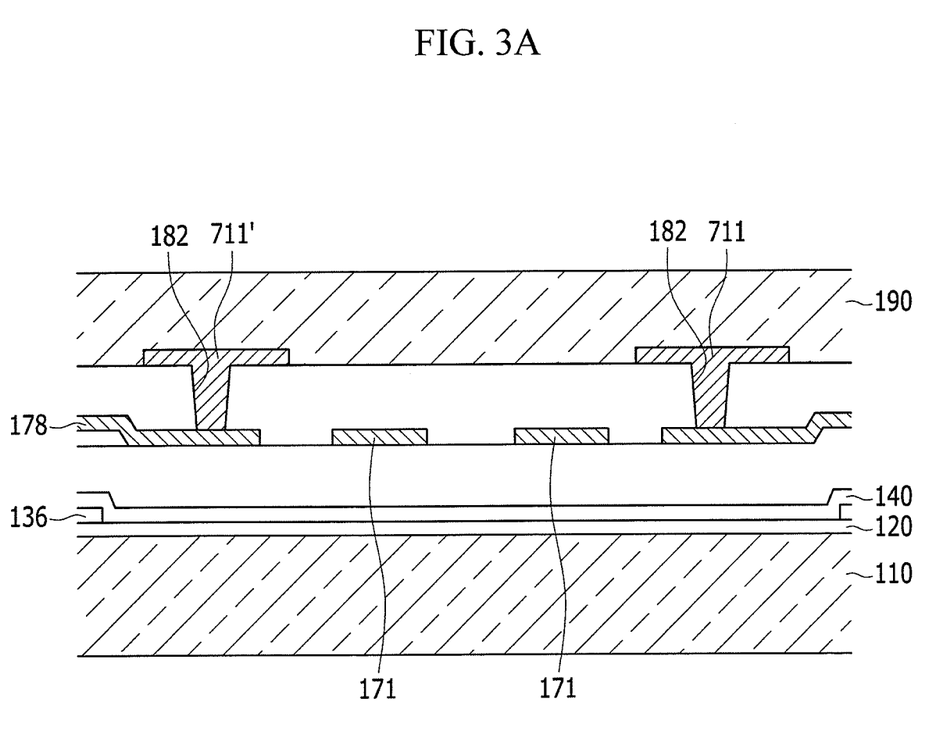
FIG. 3A to FIG. 3D illustrate cross-sectional views of FIG. 1, taken along the line and illustrate a process for restoring a failure in a manufacturing process of the OLED display according to the exemplary embodiment.

As shown in FIG. 3A, the wire portion 210 (refer to FIG. 2) may be formed on the substrate 110. The pixel electrode 710 (refer to FIG. 2) and the pixel terminals 711 and 711' extended from the pixel electrode 710 and contacting the drain electrode 178 may be formed on the wire portion 210. The pixel defining layer 190 covering the pixel terminals 711 and 711' and having the plurality of first openings 192 (refer to FIG. 2) that expose the pixel electrode 710 may be formed.

After the first pixel defining layer 190 is formed, the plurality of pixel areas are tested to detect a defective pixel 70'. In order to detect the defective pixel 70', various testing methods, such as, for example, an auto optical inspection, an array test, and the like, may be performed.

Figure 3B:
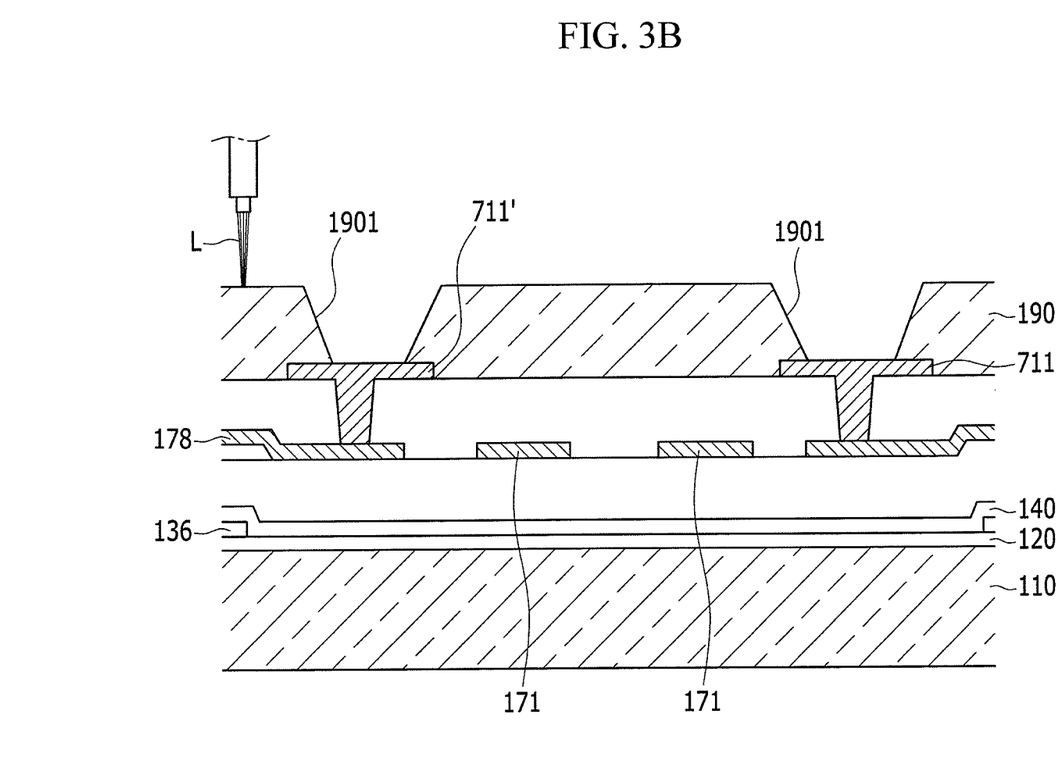

Subsequently, as shown in FIG. 3B, the connection hole 1901 may be formed to expose the pixel terminal 711' of the defective pixel 70' and the pixel terminal 711 of the normal pixel 70 that is adjacent to the pixel terminal 711'. The connection hole 1901 may be formed by patterning a photosensitive organic layer. The connection hole 1901 may have any size that can establish electrical contact between the pixel terminals 711 and 711'.

In addition, in order to block a signal applied to the pixel terminal 711', the cutting portion CT (refer to FIG. 3c) may be formed using a laser L to separate the drain electrode 177 of the defective pixel 70'.

Figure 3C:
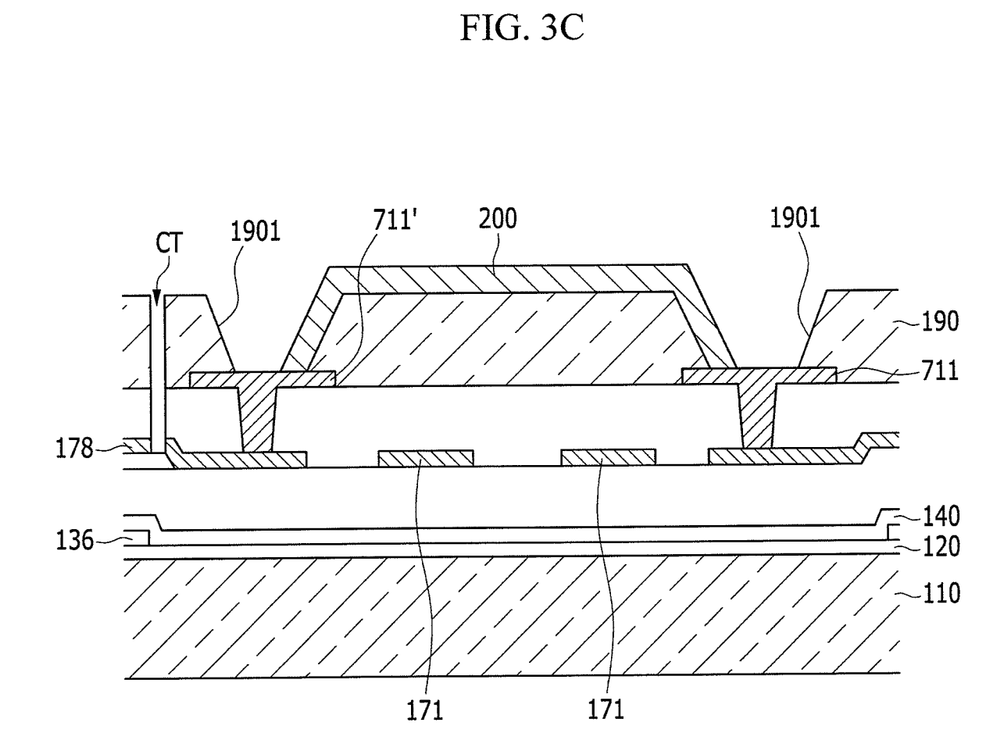

Subsequently, as shown in FIG. 3C, the connection wire 200 electrically connecting the pixel terminals 711 and 711' may be formed. The connection wire 200 may be formed to directly contact the pixel terminals 711 and 711' through the connection hole 1901 on the first pixel defining layer 190. The connection wire 200 may be formed through deposition of at least one selected from tungsten (W), chromium (Cr), molybdenum (Mo), aluminum (Al), titanium (Ti), and tantalum (Ta) or an alloy thereof using a chemical vapor deposition (CVD) method. For example, a CVD wiring method using tungsten (W) may be used. The forming of the connection wire 200 may be variously modified in various suitable configurations.

Figure 3D:
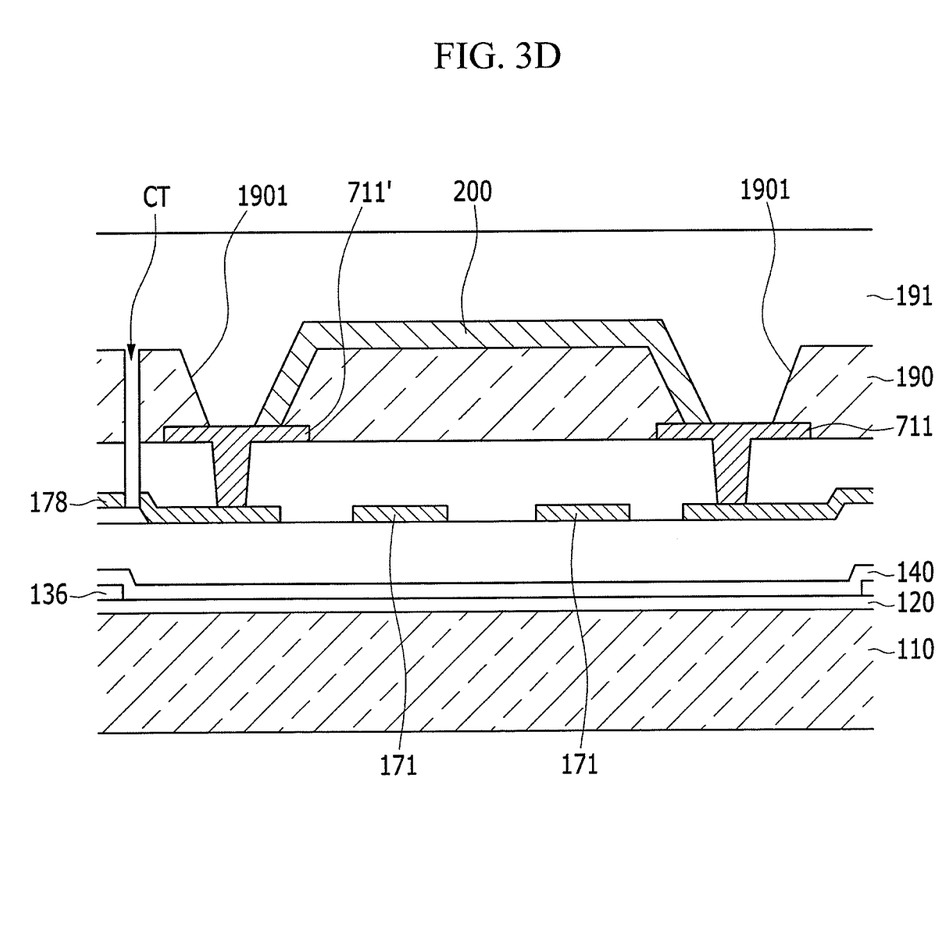

Subsequently, as shown in FIG. 3D, the second pixel defining layer 191 may be formed on the first pixel defining layer 190 to cover the connection wire 200. Like the first pixel defining layer 190, the second pixel defining layer 191 may be formed throughout the pixel area excluding an area of the second opening 193 (refer to FIG. 2) that exposes the pixel electrode 710 (refer to FIG. 2). However, the second pixel defining layer 191 may be formed in any area as long as the second pixel defining layer 191 covers the connection wire 200.

According to the manufacturing method of the OLED display including the failure recovering method, a failure occurring during the manufacturing process of the OLED display may be easily recovered. Therefore, the number of dark spots in the OLED display may be reduced, and a product yield of the OLED display may be improved.

Hereinafter, an OLED display 100' according to a second exemplary embodiment will be described with reference to FIG. 4.

Figure 4:
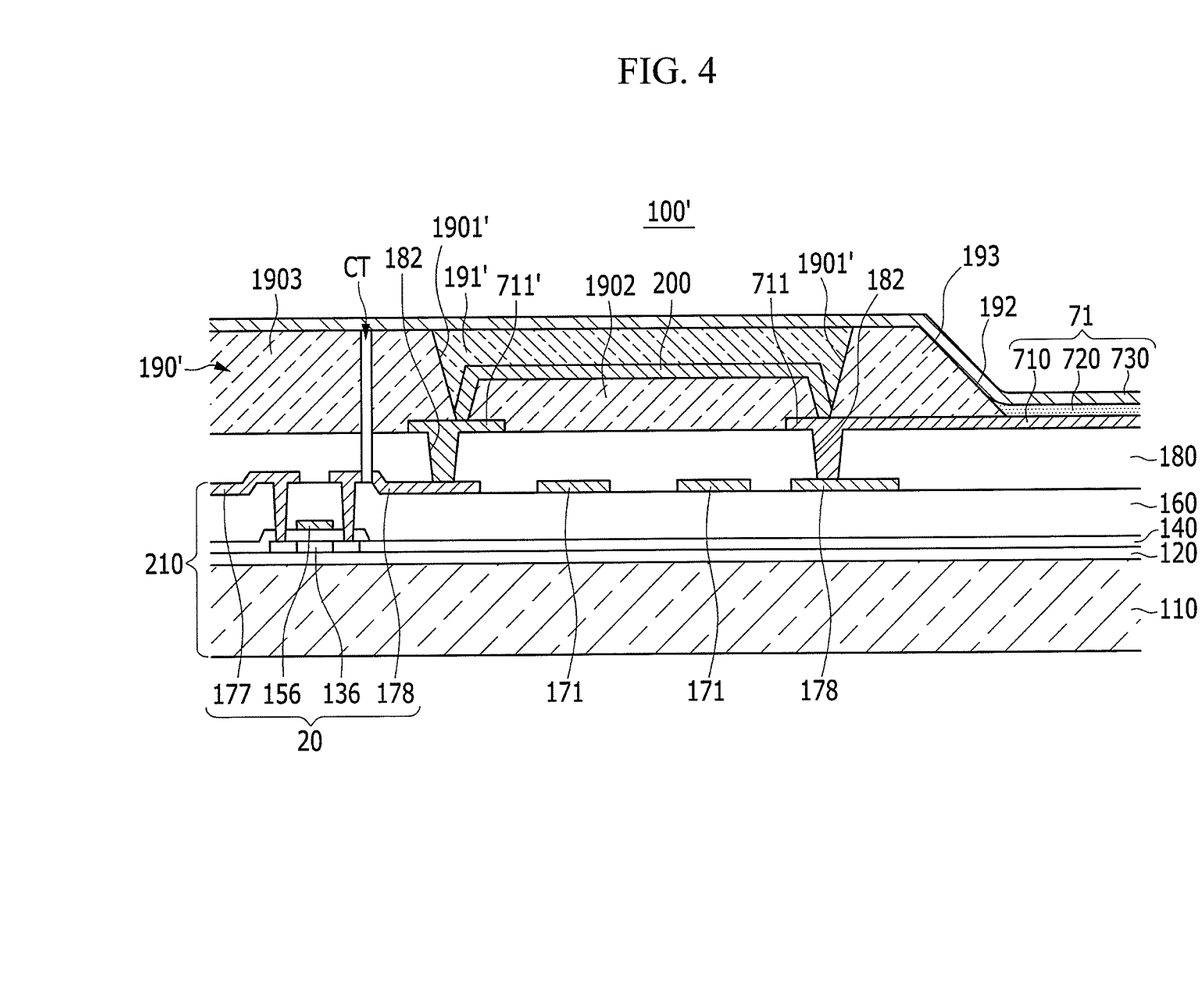
FIG. 4 illustrates a cross-sectional view of a part of an OLED display according to another exemplary embodiment.

FIG. 4 is a cross-sectional view of a part of the OLED display according to this exemplary embodiment, corresponding to the cross-section of FIG. 1, taken along the like II-II.

As shown in FIG. 4, in the OLED display 100' according to this exemplary embodiment, a second pixel defining layer 191' may be formed only between a pixel terminal 711' of a defective pixel 70' and a pixel terminal 711 of a normal pixel 70. That is, in this exemplary embodiment, a first pixel defining layer 190' has a first portion 1902 formed in a connection hole 1901' and a second portion 1903 that is different from the first portion 1902 and has a step. Here, the first portion 1902 and the second portion 1903 are separated from each other, and the second pixel defining layer 191' has a first portion 1902 that is relatively thinner than the second portion 1902.

Here, the second pixel defining layer 191' fills the connection hole 1901' over the connection wire 200 such that an upper side of the second pixel defining layer 191' substantially corresponds to an upper side of the first pixel defining layer 190'.

Meanwhile, the OLED display 100' according to this exemplary embodiment is substantially equivalent to the OLED display 100 according to the exemplary embodiment, excluding that the second pixel defining layer 191' may be formed only between the pixel terminal 711' of the defective pixel 70' and the pixel terminal 711 of the normal pixel 70.

By way of summation and review, an OLED display may incur a defect during a stage of a manufacturing process, such that a dark spot may be present at a pixel. Typically, a pixel having the defect cannot be easily repaired during the manufacturing process.

Thus, when a display device having a defect in a pixel is provided to a user, the defective pixel is recognized as a dark spot by a user such that user satisfaction may be degraded. Although a pixel having a defect may be detected during the manufacturing process, it may not be possible to repair the pixel, and thus, the OLED display including the pixel may be discarded, causing economical and environmental problems.

The described embodiments may provide an organic light emitting diode (OLED) display that may reduce the number of dark spots by enabling the repair of a defect occurring during a manufacturing process. Further, the described embodiments may provide a method for manufacturing an OLED display that may improve a product yield by simply recovering a failure that may occur during a manufacturing process. Accordingly, user satisfaction may be improved. In addition, according to the exemplary embodiments, the product yield of the OLED display may be improved, and thus, productivity may be improved. OLED displays having defective pixels may not need to be discarded, and accordingly, an environment problem may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
   a substrate having a plurality of pixels;
   a first pixel defining layer on the substrate, the first pixel defining layer dividing the plurality of pixels;
   a connection wire directly on the first pixel defining layer, the connection wire electrically connecting two adjacent pixels; and
   a second pixel defining layer on the first pixel defining layer, the second pixel defining layer directly contacting and directly covering the connection wire.

2. The OLED display of claim 1, wherein:
   each of the plurality of pixels includes a pixel electrode and a pixel terminal extending from the pixel electrode, and
   the first pixel defining layer includes one or more connection holes exposing respective pixel terminals of the two adjacent pixels.

3. The OLED display of claim 2, wherein the connection wire electrically connects the two adjacent pixels through the connection holes.

4. The OLED display of claim 1, wherein:
   one of the two adjacent pixels is a defective pixel and the another one of the two adjacent pixels is a normal pixel, and
   the defective pixel is driven by a signal applied to the normal pixel.

5. The OLED display of claim 4, wherein:
   a plurality of thin film transistors are provided between the substrate and each pixel terminal to supply a signal for driving each pixel,
   the normal pixel of the two adjacent pixels is electrically connected with a respective one of the thin film transistors corresponding to the normal pixel, and
   the defective pixel of the two adjacent pixels is electrically disconnected from a respective one the thin film transistors corresponding to the defective pixel.

6. The OLED display of claim 1, wherein the connection wire includes at least one of tungsten, chromium, molybdenum, aluminum, titanium, and tantalum, or an alloy thereof.

7. The OLED display of claim 2, wherein:
   the first pixel defining layer includes a plurality of first openings to expose each pixel electrode, and
   the second pixel defining layer includes a plurality of second openings to expose each pixel electrode.

8. The OLED display of claim 2, wherein the second pixel defining layer is disposed between pixel terminals of the two adjacent pixels.

9. An organic light emitting diode (OLED) display, comprising:
   a substrate having a plurality of pixels;
   a first pixel defining layer on the substrate, the first pixel defining layer dividing the plurality of pixels;
   a connection wire on the first pixel defining layer, the connection wire electrically connecting two adjacent pixels; and
   a second pixel defining layer on the first pixel defining layer, the second pixel defining layer covering the connection wire,
   wherein:
      each of the plurality of pixels includes a pixel electrode and a pixel terminal extending from the pixel electrode,
      the first pixel defining layer includes one or more connection holes exposing respective pixel terminals of the two adjacent pixels, and
      the second pixel defining layer is disposed to fill the connection holes.

10. An organic light emitting diode (OLED) display, comprising:
   a substrate having a plurality of pixels;
   a first pixel defining layer on the substrate, the first pixel defining layer dividing the plurality of pixels;
   a connection wire on the first pixel defining layer, the connection wire electrically connecting two adjacent pixels; and
   a second pixel defining layer on the first pixel defining layer, the second pixel defining layer covering the connection wire,
   wherein:
      each of the plurality of pixels includes a pixel electrode and a pixel terminal extending from the pixel electrode,
      the first pixel defining layer includes one or more connection holes exposing respective pixel terminals of the two adjacent pixels,
      the second pixel defining layer is disposed between pixel terminals of the two adjacent pixels,
      pixel terminals of the two adjacent pixels are exposed through a single connection hole, and
      the first pixel defining layer includes a first portion formed in a connection hole and a second portion relatively thicker than the first portion.

11. The OLED display of claim 10, wherein:
   the second pixel defining layer covers the first portion, and
   an upper side of the second pixel defining layer and an upper side of the second portion of the first pixel defining layer correspond to each other.

* * * * *